(12) United States Patent
Hsieh et al.

(10) Patent No.: US 10,164,073 B2
(45) Date of Patent: Dec. 25, 2018

(54) APPARATUS AND METHOD FOR MEMORY DEVICE

(71) Applicant: Taiwan Semiconductor Manufacturing Company, Ltd., Hsin-Chu (TW)

(72) Inventors: Ping-Pang Hsieh, Tainan (TW); Chih-Ming Lee, Tainan (TW); Yu-Jen Chen, Tainan (TW); Shiu-Ko JangJian, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 14/685,192

(22) Filed: Apr. 13, 2015

(65) Prior Publication Data

US 2015/0221752 A1    Aug. 6, 2015

Related U.S. Application Data

(62) Division of application No. 13/547,741, filed on Jul. 12, 2012.

(51) Int. Cl.
| | |
|---|---|
| *H01L 21/336* | (2006.01) |
| *H01L 29/66* | (2006.01) |
| *H01L 29/788* | (2006.01) |
| *H01L 21/28* | (2006.01) |

(52) U.S. Cl.
CPC .. *H01L 29/66825* (2013.01); *H01L 21/28273* (2013.01); *H01L 29/66575* (2013.01); *H01L 29/7881* (2013.01); *H01L 29/7883* (2013.01)

(58) Field of Classification Search
CPC ......... H01L 29/66575; H01L 29/66825; H01L 29/7883; H01L 21/28273
USPC .......................... 257/321; 438/257, 264, 265
See application file for complete search history.

(56) References Cited

U.S. PATENT DOCUMENTS

| | | | | |
|---|---|---|---|---|
| 4,728,617 | A | * 3/1988 | Woo | H01L 21/823864 148/DIG. 106 |
| 4,978,626 | A | * 12/1990 | Poon | H01L 21/28114 216/67 |
| 5,019,527 | A | 5/1991 | Ohshima et al. | |
| 5,376,571 | A | * 12/1994 | Bryant | H01L 27/115 257/E21.577 |
| 5,482,881 | A | * 1/1996 | Chen | H01L 27/11521 257/314 |
| 5,557,567 | A | 7/1996 | Bergemont et al. | |
| 5,576,232 | A | * 11/1996 | Hong | H01L 27/11517 257/E21.68 |
| 5,930,627 | A | * 7/1999 | Zhou | H01L 27/11521 257/E21.682 |
| 6,013,554 | A | * 1/2000 | Park | H01L 29/6659 257/E29.267 |
| 6,071,779 | A | 6/2000 | Mehrad et al. | |

(Continued)

OTHER PUBLICATIONS

Bez et al., "Introduction to Flash Memory", Proceedings of the IEEE 91 (2003) pp. 489-502.*

*Primary Examiner* — Jay C Kim
(74) *Attorney, Agent, or Firm* — Slater Matsil, LLP

(57) ABSTRACT

A method comprises forming a gate stack over a substrate, applying an oxygen flush process to the gate stack, forming a uniform oxide layer on the gate stack as a result of performing the step of applying the oxygen flush process and removing the uniform oxide layer through a pre-clean process.

20 Claims, 3 Drawing Sheets

(56) References Cited

U.S. PATENT DOCUMENTS

| | | | | |
|---|---|---|---|---|
| 6,288,419 B1* | 9/2001 | Prall | H01L 29/42324 | 257/213 |
| 6,326,670 B1* | 12/2001 | Nishiyama | H01L 21/28176 | 257/368 |
| 6,329,257 B1* | 12/2001 | Luning | H01L 21/28273 | 257/E21.209 |
| 6,355,524 B1* | 3/2002 | Tuan | H01L 21/31053 | 257/E21.244 |
| 6,605,521 B2* | 8/2003 | Ajmera | H01L 21/28061 | 257/E21.2 |
| 6,620,684 B2* | 9/2003 | Kim | H01L 21/28273 | 257/315 |
| 6,737,344 B2* | 5/2004 | Yamagata | H01L 21/28273 | 254/321 |
| 6,756,269 B2* | 6/2004 | Shimoda | H01L 29/66825 | 257/E21.422 |
| 6,774,012 B1* | 8/2004 | Narayanan | H01L 21/28247 | 118/52 |
| 6,812,515 B2* | 11/2004 | Rabkin | H01L 21/28273 | 257/239 |
| 6,815,760 B2* | 11/2004 | Leung | H01L 27/11521 | 257/316 |
| 6,995,414 B2* | 2/2006 | Yaegashi | H01L 21/28273 | 257/296 |
| 7,045,852 B2* | 5/2006 | Van Duuren | H01L 29/7881 | 257/316 |
| 7,060,559 B2* | 6/2006 | Ozawa | H01L 21/28273 | 257/E21.209 |
| 7,217,624 B2* | 5/2007 | Lim | G11C 16/0466 | 257/E21.196 |
| 7,229,880 B2* | 6/2007 | Dong | H01L 29/511 | 257/315 |
| 7,320,915 B2* | 1/2008 | Lee | H01L 21/28273 | 257/E21.209 |
| 7,384,843 B2* | 6/2008 | Kim | H01L 21/28273 | 257/E21.209 |
| 7,491,615 B2* | 2/2009 | Wu | H01L 29/66636 | 257/E21.633 |
| 7,575,990 B2* | 8/2009 | Wei | H01L 21/76897 | 438/586 |
| 7,754,556 B2* | 7/2010 | Feudel | H01L 21/324 | 257/262 |
| 7,816,726 B2* | 10/2010 | He | H01L 21/28282 | 257/324 |
| 7,906,806 B2* | 3/2011 | Rosmeulen | H01L 21/28273 | 257/314 |
| 7,923,767 B2* | 4/2011 | Higashitani | H01L 21/76232 | 257/314 |
| 7,951,728 B2* | 5/2011 | Yokota | H01L 21/0223 | 257/E21.268 |
| 7,985,650 B2* | 7/2011 | Mitani | H01L 21/28202 | 438/261 |
| 8,080,844 B2* | 12/2011 | Satou | H01L 21/28282 | 257/324 |
| 8,084,329 B2* | 12/2011 | Arnold | H01L 29/66636 | 257/E21.409 |
| 8,710,572 B2* | 4/2014 | Ishihara | H01L 21/28273 | 257/316 |
| 2004/0094793 A1* | 5/2004 | Noguchi | H01L 27/105 | 257/315 |
| 2005/0212035 A1* | 9/2005 | Utsuno | H01L 21/28185 | 257/315 |
| 2008/0001209 A1* | 1/2008 | Cho | H01L 27/115 | 257/321 |

* cited by examiner

APPARATUS AND METHOD FOR MEMORY DEVICE

This application is a divisional of U.S. patent application Ser. No. 13/547,741, entitled "Apparatus and Method for Memory Device," filed on Jul. 12, 2012, which application is incorporated herein by reference.

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

Flash memory is a non-volatile device that can be electrically erased and reprogrammed. A typical flash memory comprises a memory array having a large number of flash memory cells arranged in rows, columns, and blocks. One of the most commonly known flash memories is the one-transistor flash memory. The memory cell of the one-transistor flash memory is fabricated as a field-effect transistor having two gates, namely a control gate and a floating gate. The floating gate is capable of holding charges and is separated from source and drain regions.

Each of the memory cells can be electrically charged by injecting hot electrons across an oxide layer (tunneling layer) onto the floating gate. The charges can be removed from the floating gate by tunneling the electrons to the substrate through the tunneling layer during an erase operation. Thus the data in a memory cell is determined by the presence or absence of charges in the floating gate.

As technologies evolve, semiconductor process nodes have been scaled down for high density flash memory integrated circuits. As a result, the form factor of flash memory devices has been improved from shrinking the semiconductor process node (e.g., shrink the process node towards the sub-20 nm node). As semiconductor devices are scaled down, new techniques are needed to maintain the electronic components' performance from one generation to the next. For example, poor or reduced cycling and data retention capabilities are two major concerns in the tunnel oxide when the tunnel oxide traps more electrons than desired during program erase operations. Such undesirable trapping of electrons makes the overall flash memory device less efficient.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a flash memory device having two recesses between a gate stack and drain/source regions. The embodiments of the disclosure may also be applied, however, to a variety of memory semiconductor devices. Hereinafter, various embodiments will be explained in detail with reference to the accompanying drawings.

Figure 1:
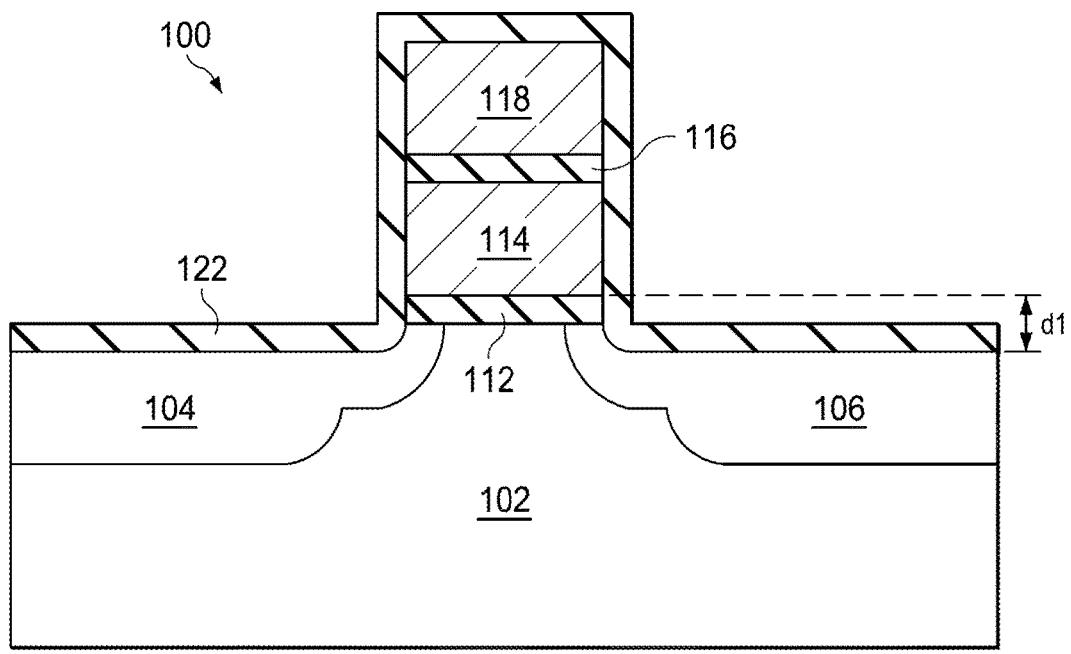
FIG. 1 illustrates a cross sectional view of a memory device in accordance with an embodiment.

FIG. 1 illustrates a cross sectional view of a memory device in accordance with an embodiment. As shown in FIG. 1, a first active region 104 and a second active region 106 are formed in a substrate 102. In addition, the first active region 104 and the second active region 106 are formed on opposite sides of a gate structure including a tunneling layer 112, a floating gate 114, an inter-poly dielectric layer 116 and a control gate 118. In accordance with an embodiment, the first active region 104 and the second active region 106 may be a drain region and a source region respectively.

As shown in FIG. 1, the tunneling layer 112 is formed over the substrate 102. The floating gate 114 is formed over the tunneling layer 112. The inter-poly dielectric layer 116 is stacked on top of the floating gate 114 and the control gate 118 is stacked on top of the inter-poly dielectric layer 116. The portions protruding over the substrate 102 form a gate stack of the memory device 100. Moreover, there may be a gate oxide layer 122 formed on the surface of the gate stack. FIG. 1 shows there may be a recess between the top surface of the active regions (e.g., the first active region 104) and the bottom of the tunneling layer 112. The height of the recess is defined as d1. In accordance with an embodiment, d1 is in a range from about 5 Angstroms to about 200 Angstroms.

The substrate 102 may be formed of suitable semiconductor materials such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 102 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 102 may be doped with a p-type dopant, such as boron, aluminum, gallium, or the like, although the substrate may alternatively be doped with an n-type dopant, as is known in the art.

In accordance with an embodiment in which the substrate 102 is a p-type substrate, the drain/source region 104 and the drain/source 106 may be formed by implanting appropriate n-type dopants such as phosphorous, arsenic, antimony, or the like. The drain/source regions 104 and 106 may be implanted using the tunneling layer 112, the floating gate 114, the blocking layer 116, the control gate 118 as masks to form the source/drain regions 104 and 106. The detailed fabrication process of the drain and source regions will be described below with respect to FIG. 4.

In accordance with an embodiment, the tunneling layer 112 may comprise oxide materials such as silicon oxide. The silicon oxide layer may be implemented using a suitable process such as furnace, rapid thermal oxide (RTO), chemical vapor deposition (CVD), low pressure chemical vapor deposition (LPCVD), plasma enhanced chemical vapor deposition (PECVD), high-density plasma chemical vapor deposition (HDPCVD), combinations of these or the like. However, any suitable deposition process may alternatively be utilized. In accordance with another embodiment, the tunneling layer 112 may comprise a high-k dielectric material such as $AlLaO_3$, $HfAlO_3$, $HfO_2$, $Ta_2O_5$, $Al_2O_3$, $ZrO_2$, $TiO_2$, $SrTiO_3$, and any combinations thereof.

The floating gate layer 114 is commonly known as a storage layer. According to the operation principles of flash memory device, the floating gate layer 114 is employed to store gate charge so that the logic statue of the memory device can be retained even if electrical power is terminated. In accordance with an embodiment, the floating gate layer 114 may be formed of heavily doped poly-silicon. In accordance with another embodiment, the floating layer 114 may be formed of silicon nitride. In accordance with yet another embodiment, floating gate layer 114 may comprises conductive materials such as metal silicides, metal nitrides and the like. In yet other embodiments, floating gate layer 114 includes nano crystal with nano crystal islands isolated by dielectric materials.

The inter-poly dielectric layer 116 is commonly known as a blocking layer. Throughout the description, the inter-poly dielectric layer 116 may be alternatively referred to as a blocking layer 116. In accordance with an embodiment, the inter-poly dielectric layer 116 may be formed of $SiO_2$—$Si_3N_4$—$SiO_2$ (ONO). In accordance with another embodiment, the inter-poly dielectric layer 116 may be formed of high-k dielectric materials such as $Al_2O_3$. It should be noted while FIG. 1 illustrates the blocking layer 116 is a single layer, the blocking layer 116 may also be a composite layer including more than one layer, each layer comprising one or more of the above-listed materials.

The control gate 118 is formed over the blocking layer 116. The control gate 118 may be formed of conductive materials such as polysilicon doped with n-type impurities, polysilicon doped with p-type impurities, metals, metal silicides, metal nitrides, and combinations thereof.

One advantageous feature of having the blocking layer 116 and the tunneling layer 112 is that these two dielectric layers prevent the gate charge of the floating gate layer 114 from leaking out to the substrate or the control gate 118. As a result, the date retention of the flash memory may be improved.

Figure 2:
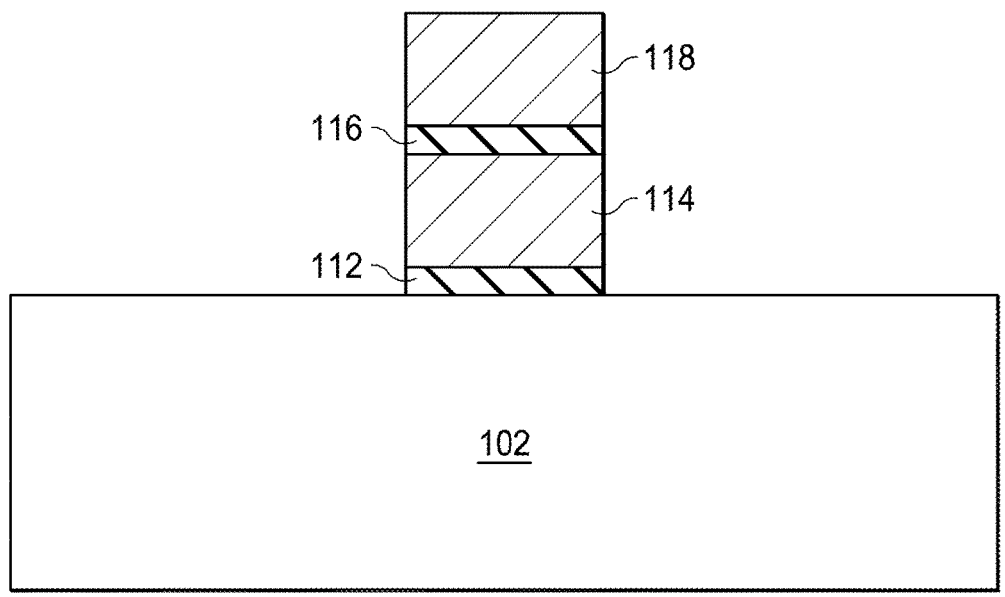
FIG. 2 illustrates a cross sectional view of a memory device after a gate stack is formed over a substrate through a patterning process in accordance with an embodiment.

FIGS. 2-6 illustrate intermediate steps of fabricating a flashing memory having two recesses in accordance with an embodiment. FIG. 2 illustrates a cross sectional view of a memory device after a gate stack is formed over a substrate through a patterning process in accordance with an embodiment. The tunneling layer 112, the floating gate 114, the blocking layer 116 and the control gate 118 may be patterned using a photolithographic masking and etching process. For example, a photosensitive material may be placed over the gate stack, exposed to an energy source such as light, and developed. Once the photoresist has been formed, one or more etching steps may be utilized to remove those regions of the tunneling layer 112, the floating gate layer 114, the blocking layer 116 and the control gate 118 that were exposed by the photoresist.

Figure 3:
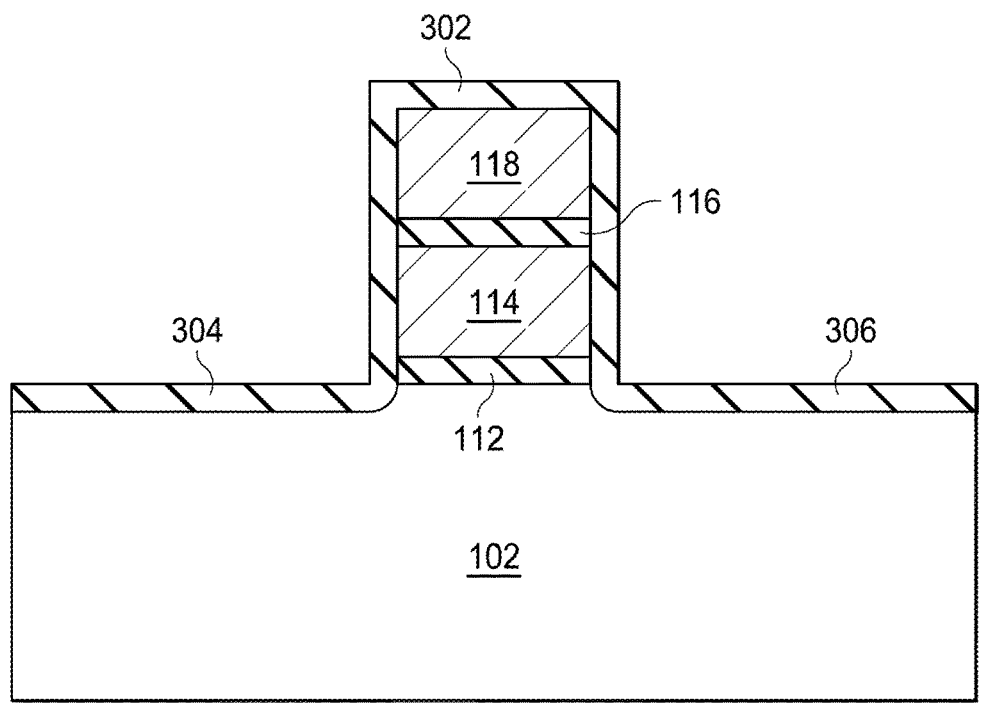
FIG. 3 illustrates a cross sectional view of a memory device after an oxygen flush process is applied to the surface of the memory device shown in FIG. 2 in accordance with an embodiment.

FIG. 3 illustrates a cross sectional view of a memory device after an oxygen flush process is applied to the surface of the memory device shown in FIG. 2 in accordance with an embodiment. In order to form a uniform oxide layer on top of the memory device, an oxygen flush process is applied to the top surface of the memory device. In accordance with an embodiment, the memory device may be placed in a dry etch chamber. The oxygen flush may be implemented by using suitable techniques such as oxygen plasma. An oxide layer 302 may grow on top of the surface of the gate stack the memory device. Likewise, oxide layers 304 and 306 may grow on top of the surface of the substrate 102. The growth rate of the oxide layer is proportional to time and the concentration of $O_2$ plasma. However, the growth rate may saturate when the thickness of the oxide layer is in a range from about 20 Angstroms to about 300 Angstroms.

The saturation of the oxide layer helps to form a uniform surface layer on top of the memory device. One advantageous feature of having such a uniform oxide surface layer is the memory device may have a uniform implantation profile in the subsequent ion implantation process. The uniform implantation profiles helps to improve the threshold voltage of the memory device. The detailed process of the ion implantation process will be described below with respect to FIG. 4.

Figure 4:
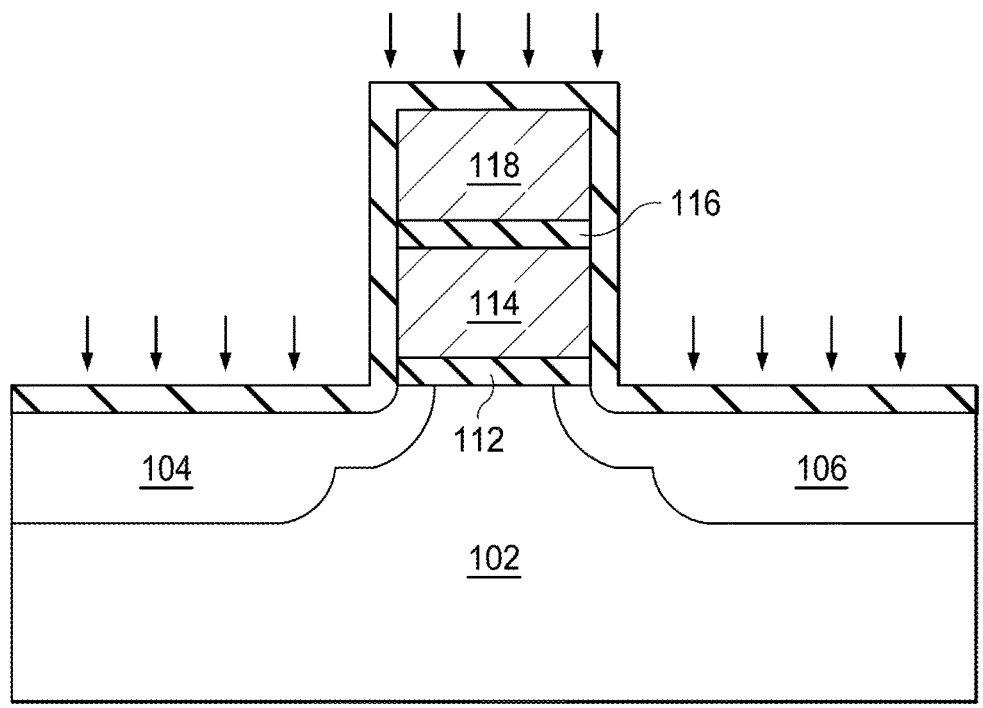
FIG. 4 illustrates a cross sectional view of a memory device after an ion implantation process is applied to the memory device shown in FIG. 3 in accordance with an embodiment.

FIG. 4 illustrates a cross sectional view of a memory device after an ion implantation process is applied to the memory device shown in FIG. 3 in accordance with an embodiment. A first drain/source region 104 and a second drain/source region 106 may be formed in the substrate 102 on opposite sides of the gate stack. In according with an embodiment in which the substrate 102 is an n-type substrate, the drain/source regions 104 and 106 may be formed by implanting appropriate p-type dopants such as boron, gallium, indium, or the like. Alternatively, in accordance with an embodiment in which the substrate 102 is a p-type substrate, the drain/source regions 104 and 106 may be formed by implanting appropriate n-type dopants such as phosphorous, arsenic, or the like. These drain/source regions 104 and 106 may be implanted using the gate stack shown in FIG. 4 as masks. A uniform implantation profile of the drain/source regions 104 and 106 helps to improve the performance of the flash memory device.

Figure 5:
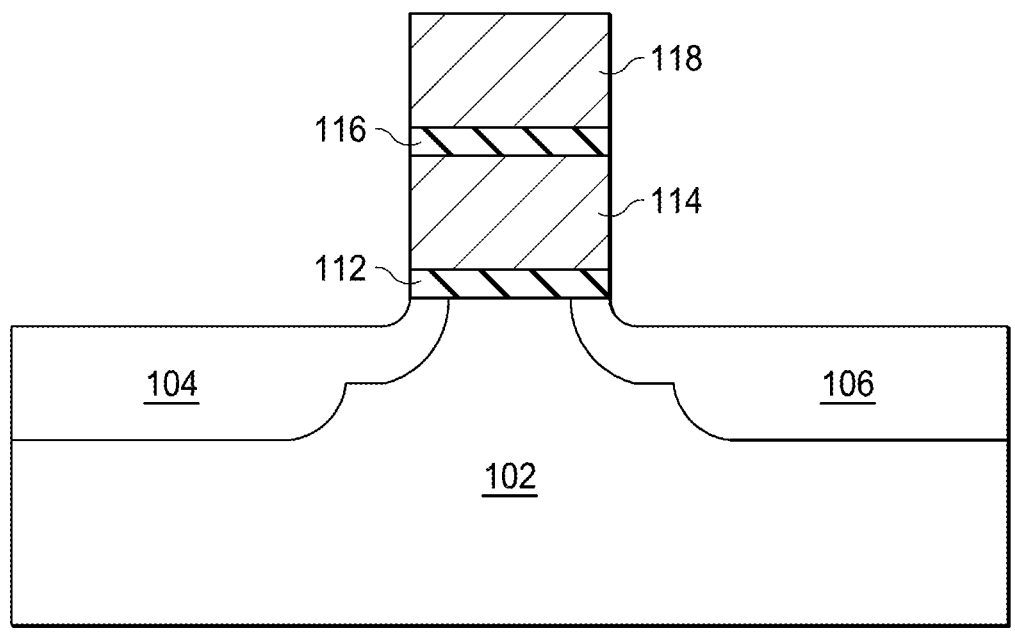
FIG. 5 illustrates a cross sectional view of a memory device after a pre-clean process is applied to the memory device shown in FIG. 4 in accordance with an embodiment.

FIG. 5 illustrates a cross sectional view of a memory device after a pre-clean process is applied to the memory device shown in FIG. 4 in accordance with an embodiment. During the formation of the gate stack through an etching process, many residues such as polymer may stay on the surface of the substrate. Such residues may have a negative impact on the performance characteristics of the flash memory. In order to improve the performance such as leakage current of the memory device, the surface of the gate stack must be cleaned before forming a gate oxide layer. A gate pre-clean process may be implemented using suitable cleaning processes such as dry cleaning or wet cleaning. In accordance with an embodiment, a wet cleaning process may comprise applying an HF solution first and performing SPM (SPM is a mixture of $H_2SO_4$ and $H_2O_2$) and APM (APM is a mixture of $NH_4OH$, $H_2O_2$ and $H_2O$) solutions subsequently.

In comparison with the cross sectional view of FIG. 4, the oxide layers on the top surface of the substrate and the gate stack have been removed after the pre-clean process is applied to the memory device. As shown in FIG. 5, there are no undercuts at the blocking layer 116 because the oxide layer (not shown but illustrated in FIG. 4) helps to prevent the ONO of the blocking layer 116 from being damaged during the pre-clean process. As a result, the blocking layer 116 is free of lateral undercuts. Such an undercut free blocking layer helps to improve the data retention of a flash memory device. In addition, by reducing the undercut at the ONO layer, a high coupling ratio flash memory device can be achieved.

Figure 6:
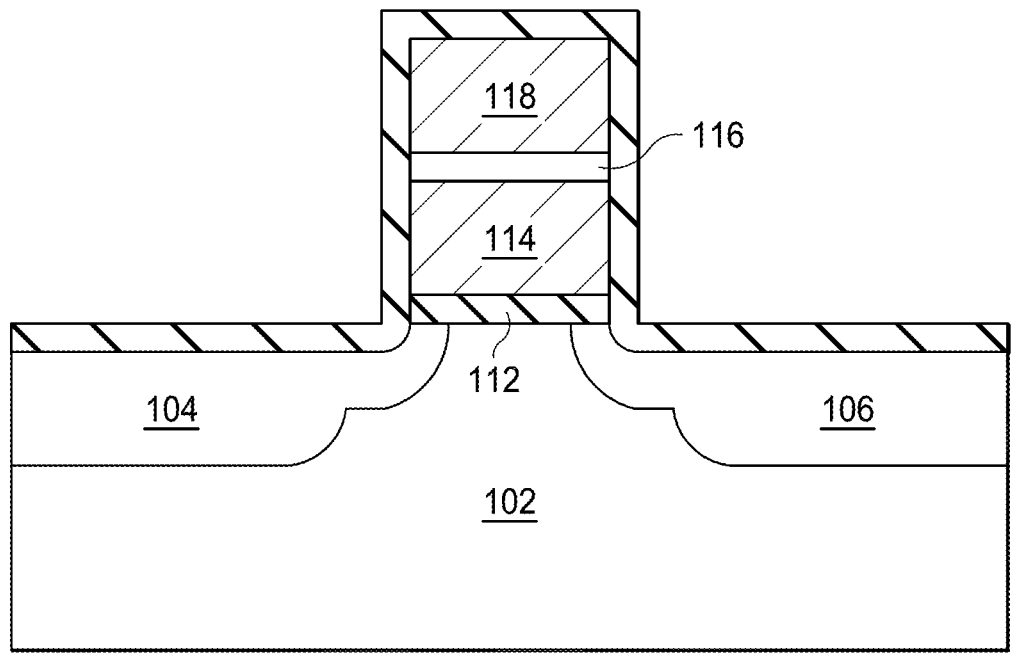
FIG. 6 illustrates a cross sectional view of a memory device after a gate oxidation process is applied to the surface of the gate stack of the memory device shown in FIG. 5 in accordance with an embodiment.

FIG. 6 illustrates a cross sectional view of a memory device after a gate oxidation process is applied to the surface of the gate stack of the memory device shown in FIG. 5 in accordance with an embodiment. The gate oxidation process may be implemented by using suitable techniques such as a thermal process, a furnace process or the like. In accordance with an embodiment, the thickness of the gate oxide layer is a range from about 15 Angstroms to about 300 Angstroms. It should be noted that FIG. 6 is not drawn to scale. The gate oxide layer is very thin.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a gate stack over a substrate, wherein the gate stack comprises:
a first gate structure, wherein a first dielectric layer is formed between the first gate structure and the substrate; and
a second gate structure stacked on the first gate structure, wherein a second dielectric layer is formed between the first gate structure and the second gate structure;
applying an oxygen plasma process to the gate stack and the substrate to form an oxide layer on the substrate, on sidewalls of the first dielectric layer, on sidewalls of the first gate structure, on sidewalls of the second dielectric layer, on sidewalls of the second gate structure, and on a top surface of the second gate structure, wherein the oxygen plasma process is applied until a thickness of the oxide layer is from 20 Angstroms to 300 Angstroms;
after forming the oxide layer on the substrate, implanting ions in the substrate through the oxide layer to form a drain region and a source region;
removing all of the oxide layer from the substrate, the sidewalls of the first dielectric layer, the sidewalls of the first gate structure, the sidewalls of the second dielectric layer, the sidewalls of the second gate structure, and the top surface of the gate stack through a pre-clean process, a first recess and a second recess remaining in the substrate after removing all of the oxide layer, wherein the first recess and the second recess are on opposite sides of the gate stack; and
after the removing all of the oxide layer from the substrate, the sidewalls of the first dielectric layer, the sidewalls of the first gate structure, the sidewalls of the second dielectric layer, the sidewalls of the second gate structure, and the top surface of the gate stack, forming a gate oxide layer on the substrate, the sidewalls of the first dielectric layer, the sidewalls of the first gate structure, the sidewalls of the second dielectric layer, the sidewalls of the second gate structure, and the top surface of the gate stack.

2. The method of claim 1, wherein:
the drain region is formed on an opposite side of the gate stack from the source region.

3. The method of claim 1, wherein:
the oxygen plasma process is an oxygen plasma flush process performed in a dry etch chamber.

4. The method of claim 1, wherein:
the first recess exposes a top surface of the drain region, the first recess extending vertically from the top surface of the drain region to a bottom surface of the first dielectric layer; and
the second recess exposes a top surface of the source region, the second recess extending vertically from the top surface of the source region to the bottom surface of the first dielectric layer.

5. The method of claim 1, wherein:
the first recess extends laterally from the gate stack along the drain region; and
the second recess extends laterally from the gate stack along the source region.

6. The method of claim 1, wherein the second dielectric layer is a $SiO_2$—$Si_3N_4$—$SiO_2$ layer, and wherein the $SiO_2$—$Si_3N_4$—$SiO_2$ layer is free of lateral undercuts after the forming the gate oxide layer.

7. A method comprising:
forming a gate stack structure over a substrate, wherein the gate stack structure comprises:
a tunneling layer formed over the substrate;
a floating gate formed over the tunneling layer;
a blocking layer formed over the floating gate; and
a control gate formed over the blocking layer;
applying an oxygen plasma process to the gate stack structure and the substrate to form an oxide layer on a top surface of the substrate, on sidewalls of the tunneling layer, on sidewalls of the floating gate, on sidewalls of the blocking layer, on sidewalls of the control gate, and on a top surface of the control gate, wherein the oxygen plasma process is applied in a dry etch chamber until a thickness of the oxide layer is from 20 Angstroms to 300 Angstroms;

after forming the oxide layer, implanting ions in the substrate through the oxide layer to form active regions on opposite sides of the gate stack structure;

removing all of the oxide layer from the top surface of the substrate, the sidewalls of the tunneling layer, the sidewalls of the floating gate, the sidewalls of the blocking layer, the sidewalls of the control gate, and the top surface of the control gate, recesses remaining in the substrate exposing surfaces of the active regions after removing all of the oxide layer; and after removing all of the oxide layer, forming a gate oxide layer on the sidewalls of the tunneling layer, the sidewalls of the floating gate, the sidewalls of the blocking layer, the sidewalls of the control gate, the top surface of the control gate, and the exposed surfaces of the active regions.

8. The method of claim 7, further comprising:
removing all of the oxide layer through a pre-clean process.

9. The method of claim 8, wherein:
the pre-clean process is a wet cleaning process.

10. The method of claim 8, further comprising:
after the step of removing all of the oxide layer from the substrate through the pre-clean process, forming the gate oxide layer physically contacting the sidewalls of the tunneling layer, the sidewalls of the floating gate, the sidewalls of the blocking layer, the sidewalls of the control gate, the top surface of the control gate, and the exposed surfaces of the active regions.

11. The method of claim 10, wherein:
the gate oxide layer has a thickness in a range from 15 Angstroms to 300 Angstroms.

12. The method of claim 7, wherein:
the recesses extend vertically from the exposed surfaces of the active regions to a bottom surface of the tunneling layer a distance of from 5 Angstroms to 200 Angstroms.

13. The method of claim 7, wherein:
the recesses extend laterally from the gate stack structure along the active regions.

14. The method of claim 7, wherein the blocking layer is an $SiO_2$—$Si_3N_4$—$SiO_2$ layer free of lateral undercuts.

15. A method comprising:
forming a gate stack on a substrate;
applying an oxygen plasma process to the gate stack and the substrate to form a first oxide layer on the substrate and the gate stack, the first oxide layer having a thickness of from 20 Angstroms to 300 Angstroms along a top surface of the substrate, sides of the gate stack, and a top surface of the gate stack;

after forming the first oxide layer, applying an ion implantation process to the gate stack and the substrate, wherein through the ion implantation process, a drain region and a source region are formed under the first oxide layer on opposite sides of the gate stack;

applying a pre-cleaning process to the gate stack and the substrate, wherein all of the first oxide layer is removed from the top surface of the substrate, the sides of the gate stack, and the top surface of the gate stack after the pre-cleaning process, wherein after the step of applying the pre-cleaning process to the gate stack and the substrate:
  a first recess is formed in the substrate, the first recess extending vertically from a top surface of the drain region to a bottom surface of the gate stack; and
  a second recess is formed in the substrate, the second recess extending vertically from a top surface of the source region to the bottom surface of the gate stack; and after all of the first oxide layer is removed from the top surface of the substrate, the sides of the gate stack, and the top surface of the gate stack, growing a second oxide layer on and physically contacting the sides and the top surface of the gate stack, in the first recess, and in the second recess.

16. The method of claim 15, further comprising:
implementing the oxygen plasma process by using oxygen plasma in a dry etch chamber.

17. The method of claim 15, wherein the step of forming the gate stack on the substrate comprises:
depositing a tunneling layer on the substrate;
depositing a floating gate on the tunneling layer;
depositing a blocking layer on the floating gate; and
depositing a control gate on the blocking layer.

18. The method of claim 17, wherein the step of depositing the blocking layer on the floating gate comprises:
forming a $SiO_2$—$Si_3N_4$—$SiO_2$ layer between the floating gate and the control gate, wherein the $SiO_2$—$Si_3N_4$—$SiO_2$ layer is free of lateral undercuts.

19. The method of claim 15, wherein:
the first recess extends vertically between the top surface of the drain region and the bottom surface of the gate stack a distance of from 5 Angstroms to 200 Angstroms; and
the second recess extends vertically between the top surface of the source region and the bottom surface of the gate stack a distance of from 5 Angstroms to 200 Angstroms.

20. The method of claim 15, wherein:
the first recess extends laterally from the gate stack along the drain region; and
the second recess extends laterally from the gate stack along the source region.

* * * * *